United States Patent
Iwawaki et al.

(10) Patent No.: US 11,799,454 B2
(45) Date of Patent: Oct. 24, 2023

(54) CIRCUIT DEVICE

(71) Applicant: Seiko Epson Corporation, Tokyo (JP)

(72) Inventors: Takanori Iwawaki, Suwa (JP);
Motoaki Nishimura, Chino (JP);
Yoshihiko Nimura, Hara (JP); Katsumi Inoue, Matsumoto (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/707,069

(22) Filed: Mar. 29, 2022

(65) Prior Publication Data
US 2022/0321106 A1    Oct. 6, 2022

(30) Foreign Application Priority Data
Mar. 30, 2021   (JP) ................. 2021-056396

(51) Int. Cl.
*H03K 3/011*    (2006.01)
(52) U.S. Cl.
CPC .................. *H03K 3/011* (2013.01)
(58) Field of Classification Search
None
See application file for complete search history.

(56) References Cited

U.S. PATENT DOCUMENTS

| | | | | |
|---|---|---|---|---|
| 7,847,525 | B2* | 12/2010 | Okamoto | H02P 29/66 322/44 |
| 8,203,314 | B2* | 6/2012 | Odaohhara | H02J 7/007194 320/128 |
| 8,450,982 | B2* | 5/2013 | Matsuda | H02J 7/007192 320/152 |
| 2003/0090238 | A1* | 5/2003 | Wolin | H02J 7/007194 320/150 |
| 2008/0212249 | A1* | 9/2008 | Grewe | H02J 7/007192 361/103 |

FOREIGN PATENT DOCUMENTS

JP         2018-072498 A       5/2018

* cited by examiner

*Primary Examiner* — Kenneth B Wells
(74) *Attorney, Agent, or Firm* — Harness, Dickey & Pierce, P.L.C.

(57) ABSTRACT

A circuit device includes a control circuit configured to control a transistor current based on a detected temperature. The detected temperature is a temperature detected by a temperature sensor circuit that detects a temperature of a transistor. The transistor charges a load to which a power supply voltage is supplied. The transistor current is a current flowing through the transistor during charging. The control circuit reduces the transistor current when the detected temperature is higher than a first threshold value, and increases the transistor current when the detected temperature is lower than a second threshold value lower than the first threshold value.

12 Claims, 9 Drawing Sheets

CIRCUIT DEVICE

The present application is based on, and claims priority from JP Application Serial Number 2021-056396, filed Mar. 30, 2021, the disclosure of which is hereby incorporated by reference herein in its entirety.

BACKGROUND

1. Technical Field

The present disclosure relates to a circuit device and the like.

2. Related Art

JP-A-2018-072498 describes a power supply unit that reduces a defect caused by heat generation of a field effect transistor provided in an inrush current prevention circuit. The power supply unit includes a first power supply that supplies a first voltage to a load and the inrush current prevention circuit. The inrush current prevention circuit reduces an inrush current by shunting an output current of the first power supply into a load side different from another load to which the first voltage is supplied. The inrush current protection circuit includes the field effect transistor and a thermistor that measures a temperature of the field effect transistor. When the temperature of the field effect transistor is determined to be a warning temperature, the field effect transistor is put into a drive stop state.

Objects are to reduce heat generation of a transistor that charges a load or a transistor that discharges the load, and to charge or discharge the load as soon as possible by a current flowing through the transistor. In JP-A-2018-072498, since the output current of the first power supply is shunted into the load side different from the other load to which the first voltage is supplied, it cannot accelerate charging of the load to which the first power supply is supplied even if the field effect transistor allows a current to flow.

SUMMARY

One aspect of the present disclosure relates to a circuit device including a control circuit configured to control a transistor current flowing through a transistor in charging based on a detected temperature detected by a temperature sensor circuit that detects a temperature of the transistor, the transistor charging a load to which a power supply voltage is supplied, in which the control circuit reduces the transistor current when the detected temperature is higher than a first threshold value, and increases the transistor current when the detected temperature is lower than a second threshold value lower than the first threshold value.

Another aspect of the present disclosure relates to a circuit device including a control circuit configured to control a transistor current flowing through a transistor in discharging based on a detected temperature detected by a temperature sensor circuit that detects a temperature of the transistor, the transistor discharging a load to which a power supply voltage is supplied, in which the control circuit reduces the transistor current when the detected temperature is higher than a first threshold value, and increases the transistor current when the detected temperature is lower than a second threshold value lower than the first threshold value.

DESCRIPTION OF EXEMPLARY EMBODIMENTS

Hereinafter, a preferred embodiment of the present disclosure will be described in detail. The present embodiment to be described below does not unduly limit contents described in the claims, and all configurations described in the present embodiment are not necessarily essential constituent elements.

1. Circuit Device and Electronic Device

Figure 1:
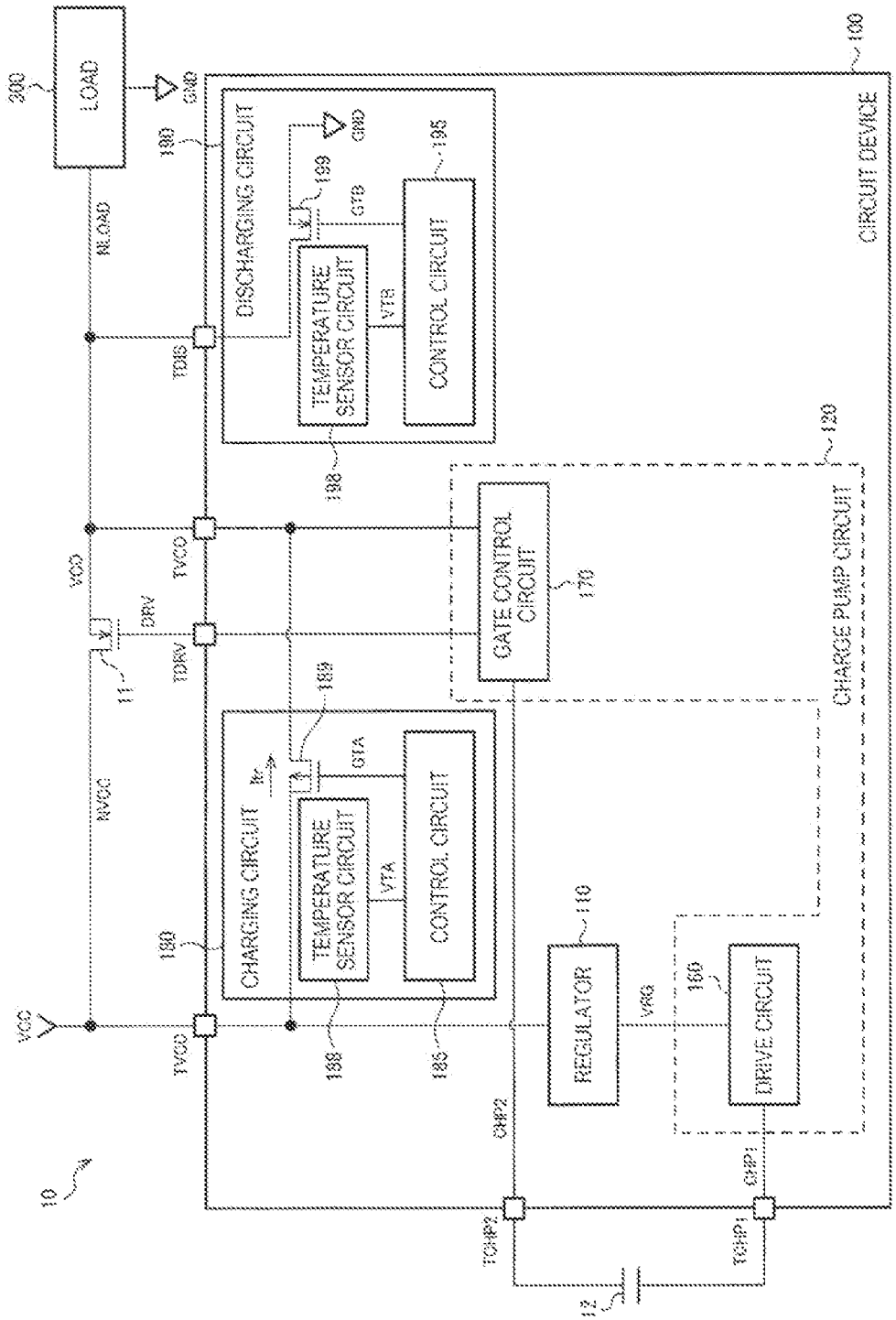
FIG. 1 is a configuration example of a circuit device and an electronic device.

FIG. 1 is a configuration example of a circuit device 100 and an electronic device 10 according to the present embodiment. The electronic device 10 includes an external transistor 11, a load 300, and the circuit device 100. Hereinafter, an example will be mainly described in which the external transistor 11 is an N-type transistor. However, the present disclosure is not limited thereto, and the external transistor 11 may be a P-type transistor.

The electronic device 10 may be, for example, a printing device, an image projection device, a wearable device, an information processing device, a display device, a television receiver, a portable information terminal, or the like, but is not limited to these devices, and may be various devices that use a DC power supply voltage VCC.

The external transistor 11 is provided between a power supply node NVCC and the load 300. Specifically, a drain of the external transistor 11 is coupled to the power supply node NVCC, and a source thereof is coupled to a node NLOAD of the load 300. The external transistor 11 is a so-called power transistor, supplies the power supply voltage VCC to the load 300 when the external transistor 11 is on, and cuts off a supply of the power supply voltage VCC to the load 300 when the external transistor 11 is off.

The power supply voltage VCC is supplied to the power supply node NVCC from DC power sources. The DC power sources are, for example, ACDC converters, DCDC converters or batteries. Although not shown in FIG. 1, these DC power sources may be provided in the electronic device 10.

The load 300 is a circuit operated by the power supply voltage VCC supplied to the node NLOAD via the external transistor 11. The node NLOAD is a power node of the load 300. The load 300 is, for example, a power supply stabilizing capacitor that is provided between the node NLOAD and a ground voltage GND, a processing device that executes processing in the electronic device 10, a motor driver that drives a motor, or the like. The load 300 is not limited thereto, and may be a circuit that implements various functions in the electronic device 10.

The circuit device 100 controls the supply of the power supply voltage VCC to the load 300 by outputting a gate control voltage DRV to a gate of the external transistor 11. The circuit device 100 includes a regulator 110, a charge pump circuit 120, a charging circuit 180, a discharging circuit 190, and terminals TCHP1, TCHP, TVCC, TDRV, TVCO, and TDIS. The circuit device 100 is, for example, an integrated circuit device in which a plurality of circuit elements are integrated at a semiconductor substrate. Each terminal is, for example, a pad of the integrated circuit device or a terminal of a package accommodating the integrated circuit device.

The regulator 110 outputs a regulated voltage VRG by regulating the power supply voltage VCC from the power supply node NVCC. The terminal TVCC is coupled to the power supply node NVCC, and the power supply voltage VCC is supplied to the regulator 110 via the terminal TVCC. The regulator 110 is a buck regulator that outputs the regulated voltage VRG lower than the power supply voltage VCC. The regulator 110 is, for example, a linear regulator, but is not limited thereto, and may be various types of DCDC converters.

The charge pump circuit 120 outputs the gate control voltage DRV=VCO+VRG higher than a source voltage VCO by boosting the source voltage VCO of the external transistor 11 with the regulated voltage VRG. Accordingly, when the charge pump circuit 120 operates, the external transistor 11 is turned on. Therefore, the power supply voltage VCC is supplied to the load 300 via the external transistor 11.

Specifically, one end of a boosting capacitor 12 is coupled to the terminal TCHP1, the other end of the boosting capacitor 12 is coupled to a terminal TCHP2, and the gate of the external transistor 11 is coupled to the terminal TDRV. The charge pump circuit 120 includes a drive circuit 160 and a gate control circuit 170. The drive circuit 160 outputs a drive signal CHP1 to the one end of the boosting capacitor 12 based on the regulated voltage VRG. A signal CHP2 from the other end of the boosting capacitor 12 is input to the gate control circuit 170. The gate control circuit 170 outputs the gate control voltage DRV=VCO+VRG based on the signal CHP2 and the source voltage VCO of the external transistor 11. The gate control voltage DRV is output to the gate of the external transistor 11 via the terminal TDRV.

When the external transistor 11 is the P-type transistor, the source voltage of the external transistor 11 is the power supply voltage VCC. The charge pump circuit 120 may output a gate control voltage DRV=VCC−VRG lower than the power supply voltage VCC by bucking the power supply voltage VCC with the regulated voltage VRG.

The charging circuit 180 charges a capacity of the node NLOAD of the load 300 before the external transistor 11 is turned on. Accordingly, an inrush current when the external transistor 11 is turned on is reduced. The capacity of the node NLOAD of the load 300 is, for example, a capacity of the power supply stabilizing capacitor coupled to the node NLOAD. The charging circuit 180 includes a transistor 189, a temperature sensor circuit 188, and a control circuit 185.

The transistor 189 is provided between the power supply node NVCC and the node NLOAD. Specifically, the transistor 189 is a P-type transistor, and includes a source coupled to the terminal TVCC and a drain coupled to the terminal TVCO. The terminal TVCO is a terminal coupled to the source of the external transistor 11 and the node NLOAD. Although FIG. 1 shows an example in which the transistor 189 is the P-type transistor, the transistor 189 may be an N-type transistor.

The temperature sensor circuit 188 detects a temperature of the transistor 189 and outputs a temperature detection voltage VTA whose voltage value changes according to the detected temperature. The temperature sensor circuit 188 is provided in the vicinity of the transistor 189 such that the temperature of the transistor 189 can be detected. The temperature sensor circuit 188 is, for example, a temperature sensor utilizing temperature dependence of a forward voltage of a PN junction, but is not limited thereto, and may be various types of temperature sensors.

The control circuit 185 controls a transistor current by controlling a gate voltage GTA of the transistor 189. The transistor current in the charging circuit 180 is a current flowing through the transistor 189. The control circuit 185 controls the transistor current based on the temperature detection voltage VTA to prevent a failure due to heat generation of the transistor 189. The control circuit 185 controls a flow of the transistor current as much as possible within a range in which the transistor 189 can be maintained at an allowable temperature or lower. Details of the control will be described below.

The discharging circuit 190 discharges the capacity of the node NLOAD of the load 300 after the external transistor 11 is turned off. Accordingly, after the external transistor 11 is turned off, it is possible to prevent a defect due to voltages held in the capacity of the node NLOAD or charges accumulated in the capacity of the node NLOAD. The discharging circuit 190 includes a transistor 199, a temperature sensor circuit 198, and a control circuit 195.

The transistor 199 is provided between the node NLOAD and a ground node. Specifically, the transistor 199 is an N-type transistor, and includes a source coupled to the ground node and a drain coupled to the terminal TDIS. The terminal TDIS is a terminal coupled to the node NLOAD of the load 300.

The temperature sensor circuit 198 detects a temperature of the transistor 199 and outputs a temperature detection voltage VTB whose voltage value changes according to the detected temperature. The temperature sensor circuit 198 is provided in the vicinity of the transistor 199 such that the temperature of the transistor 199 can be detected. The temperature sensor circuit 198 is, for example, a temperature sensor utilizing temperature dependence of a forward voltage of a PN junction, but is not limited thereto, and may be various types of temperature sensors.

The control circuit 195 controls a transistor current by controlling a gate voltage GTB of the transistor 199. The transistor current in the discharging circuit 190 is a current flowing through the transistor 199. The control circuit 195 controls the transistor current based on the temperature detection voltage VTB to prevent a failure due to heat generation of the transistor 199. The control circuit 195 controls a flow of the transistor current as much as possible within a range in which the transistor 199 can be maintained at an allowable temperature or lower. Details of the control will be described below.

Figure 2:
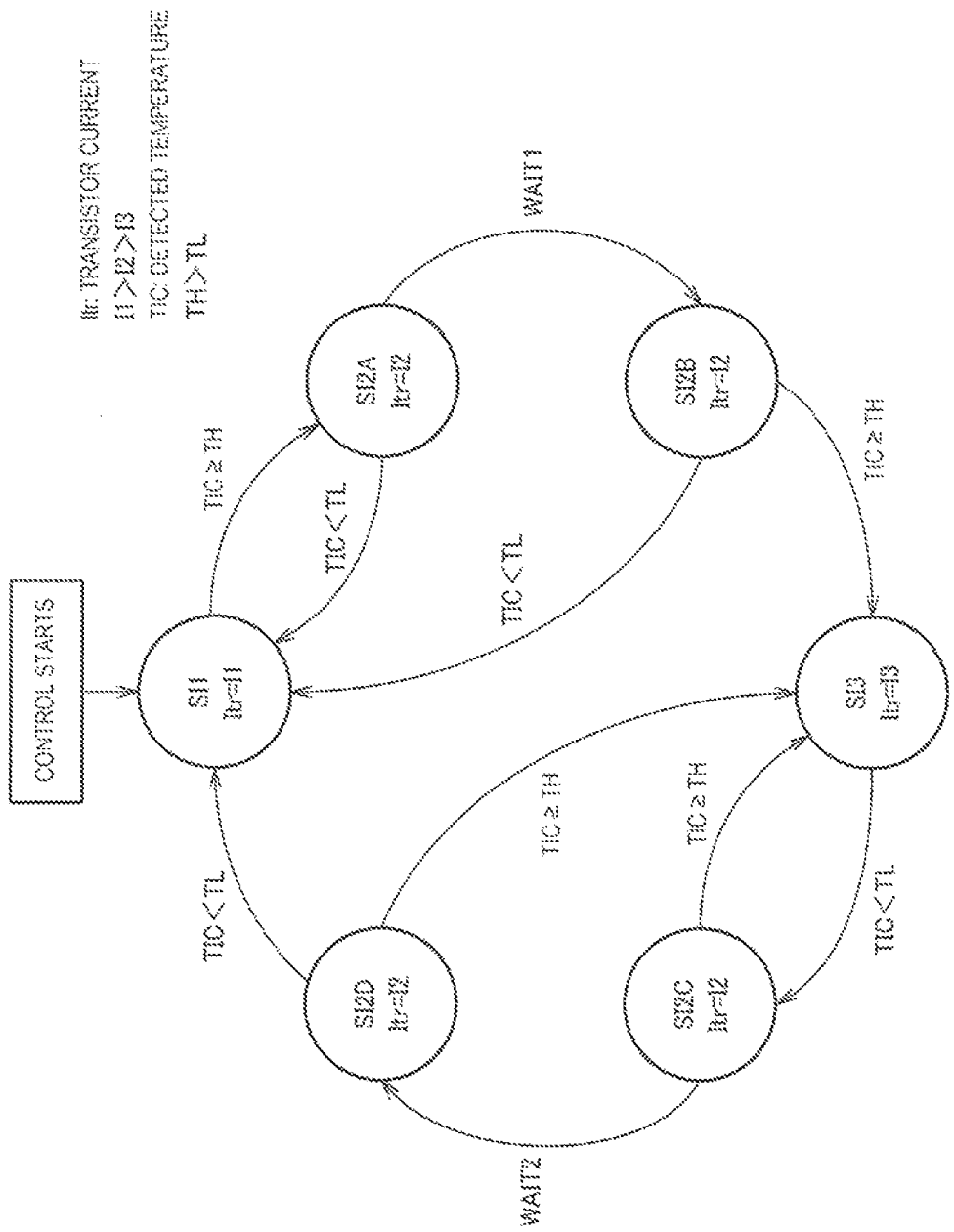
FIG. 2 is a state transition diagram of control executed by a control circuit.

FIG. 2 is a state transition diagram of control executed by the control circuit 185 of the charging circuit 180 and the control circuit 195 of the discharging circuit 190. Hereinafter, the control executed by the control circuit 185 will be described as an example, and the same applies to the control of the control circuit 195. In the following, an example will be described in which possible current values of a transistor current Itr are three current values which are a first current value I1, a second current value I2, and a third current value I3, and possible current values of the transistor current Itr may be four or more current values.

The second current value I2 is smaller than the first current value I1, and the third current value I3 is smaller than the second current value I2. If the first current value I1 is 100%, for example, the second current value I2 is 50% of I1 and the third current value I3 is 0% of I1. However, the current values are not limited thereto, and are sufficient if I1>I2>I3.

When charging control is started, the control circuit 185 transitions to a state SI1 and sets the transistor current Itr to I1. When a detected temperature TIC is equal to or higher than a first threshold value TH in the state SI1, the control circuit 185 transitions to a state SI2A and sets the transistor current Itr to I2 smaller than I1. The first threshold value TH is set to a temperature lower than an upper limit temperature at which a junction of the transistor 189 does not fail due to heat.

The control circuit 185 transitions to the state SI1 when the detected temperature TIC is lower than a second threshold value TL before a first period WAIT1 elapses after the transition to the state SI2A. The second threshold value TL is a temperature lower than the first threshold value TH. The second threshold value TL is set to a temperature at which the transistor current Itr can be maintained to a certain extent, and is, for example, a temperature several to several tens of degrees lower than the first threshold value TH. In the state SI2A, the control circuit 185 does not determine whether the detected temperature TIC is equal to or higher than the first threshold value TH. The control circuit 185 transitions to a state SI2B when the first period WAIT1 elapses after the transition to the state SI2A, and determines whether the detected temperature TIC is equal to or higher than the first threshold value TH, and determines whether the detected temperature TIC is lower than the second threshold value TL.

The control circuit 185 transitions to the state SI1 when the detected temperature TIC is lower than the second threshold value TL in the state SI2B. When the detected temperature TIC is equal to or higher than the first threshold value TH in the state SI2B, the control circuit 185 transitions to a state SI3 and sets the transistor current Itr to I3 lower than I2.

When the control circuit 185 transitions from the state SI1 to the state SI2A, the transistor current Itr drops to I2. Therefore, a heat generation amount of the transistor 189 drops. At this time, the temperature of the transistor 189 may or may not decrease. When the control circuit 185 transitions from the state SI1 to the state SI2A, it is considered that the temperature of the transistor 189 temporarily exceeds the first threshold value TH. Therefore, when the temperature starts to decrease, the first period WAIT1 is set as a wait time for waiting for the detected temperature TIC to fall below the first threshold value TH. On the other hand, when the temperature of the transistor 189 does not decrease after the transition to the state SI2A, the control circuit 185 transitions from the state SI2B to the state SI3 after the first period WAIT1 elapses, and the transistor current Itr drops to I3.

When the detected temperature TIC is lower than the second threshold value TL in the state SI3, the control circuit 185 transitions to a state SI2C and sets the transistor current Itr to I2 larger than I3.

The control circuit 185 transitions to the state SI3 when the detected temperature TIC is equal to or higher than the first threshold value TH before a second period WAIT2 elapses after the transition to the state SI2C. In the state SI2C, the control circuit 185 does not determine whether the detected temperature TIC is lower than the second threshold value TL. The control circuit 185 transitions to a state SI2D when the second period WAIT2 elapses after the transition to the state SI2C, determines whether the detected temperature TIC is equal to or higher than the first threshold value TH, and determines whether the detected temperature TIC is lower than the second threshold value TL.

The control circuit 185 transitions to the state SI3 when the detected temperature TIC is equal to or higher than the first threshold value TH in the state SI2D. When the detected temperature TIC is lower than the second threshold value TL in the state SI2D, the control circuit 185 transitions to the state SI1 and sets the transistor current Itr to I1 larger than I2.

When the control circuit 185 transitions from the state SI3 to the state SI2C, the transistor current Itr rises to I2. Therefore, the heat generation amount of the transistor 189 rises. At this time, the temperature of the transistor 189 may start to rise or may not rise. When the control circuit 185 transitions from the state SI3 to the state SI2C, it is considered that the temperature of the transistor 189 is temporarily below the second threshold value TL. Therefore, when the temperature starts to rise, the second period WAIT2 is set as a wait time for waiting for the detected temperature TIC to exceed the second threshold value TL. On the other hand, when the temperature of the transistor 189 does not rise after the transition to the state SI2C, the control circuit 185 transitions from the state SI2D to the state SI1 after the second period WAIT2 elapses, and the transistor current Itr rises to I1.

The second period WAIT2 is longer than the first period WAIT1. Since heat of the transistor 189 diffuses to surroundings, it is assumed that the temperature of the transistor 189 rises slower than the temperature of the transistor 189 drops. Therefore, the second period WAIT2 for waiting for the detected temperature TIC to exceed the second threshold value TL is set longer than the first period WAIT1 for waiting for the detected temperature TIC to fall below the first threshold value TH.

Figure 3:
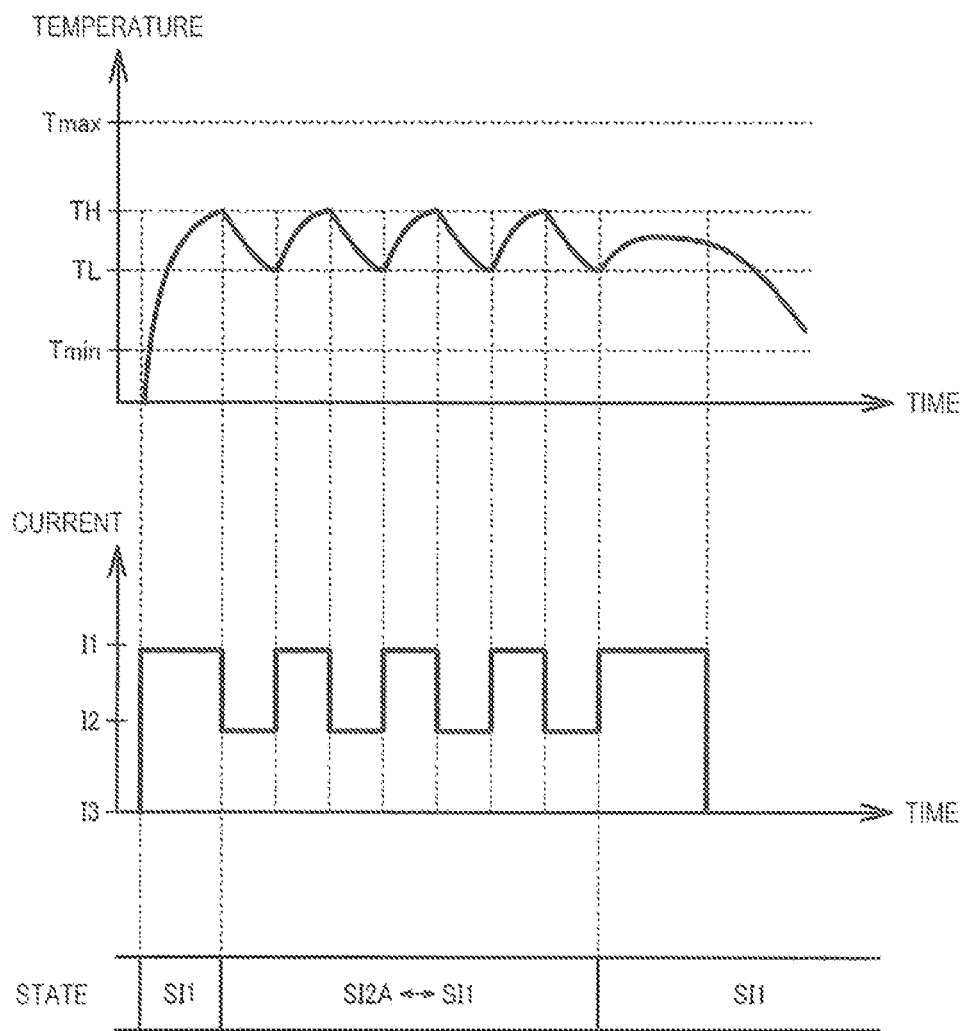
FIG. 3 is a first waveform diagram showing an operation of a charging circuit.

FIG. 3 is a first waveform diagram showing an operation of the charging circuit 180. Here, an example of reciprocating between the states SI1 and SI2A is shown. Hereinafter, the operation of the charging circuit 180 will be described as an example, and the same applies to an operation of the discharging circuit 190. However, in charging, a voltage of the node NLOAD of the load 300 gradually increases with charging, but in discharging, the voltage of the node NLOAD of the load 300 gradually decreases with discharging.

When the charge control is started, the control circuit 185 transitions to the state SI1, the transistor 189 passes the transistor current Itr=I1, the transistor 189 generates heat, and the detected temperature TIC rises. When the detected temperature TIC reaches the first threshold value TH, the control circuit 185 transitions to the state SI2A, and the transistor current Itr drops to I2. When the heat generation amount of the transistor 189 decreases and the detected temperature TIC decreases and falls below the second threshold value TL, the control circuit 185 transitions to the state SI1 and the transistor current Itr increases to I1. Then, by repeating the states SI1 and SI2A until the node NLOAD of the load 300 rises near the power supply voltage VCC, the temperature of the transistor 189 is maintained between the first threshold value TH and the second threshold value TL. Accordingly, since the temperature of the transistor 189 does not exceed the first threshold value TH, which is an allowable temperature, the transistor 189 can be protected from overheating. Since the transistor current is controlled such that the temperature of the transistor 189 does not fall below the second threshold value TL, the transistor 189 can charge the capacity of the node NLOAD of the load 300 with the transistor current as large as possible.

When the node NLOAD reaches the vicinity of the power supply voltage VCC, a voltage between the source and the drain of the transistor 189 decreases, and the heat generation amount of the transistor 189 decreases. Therefore, the state SI1 is maintained. When the capacity of the node NLOAD is charged to the power supply voltage VCC, no current flows through the transistor 189. Then, the control circuit 185 turns off the transistor 189, and the charge pump circuit 120 operates to turn on the external transistor 11.

Figure 4:
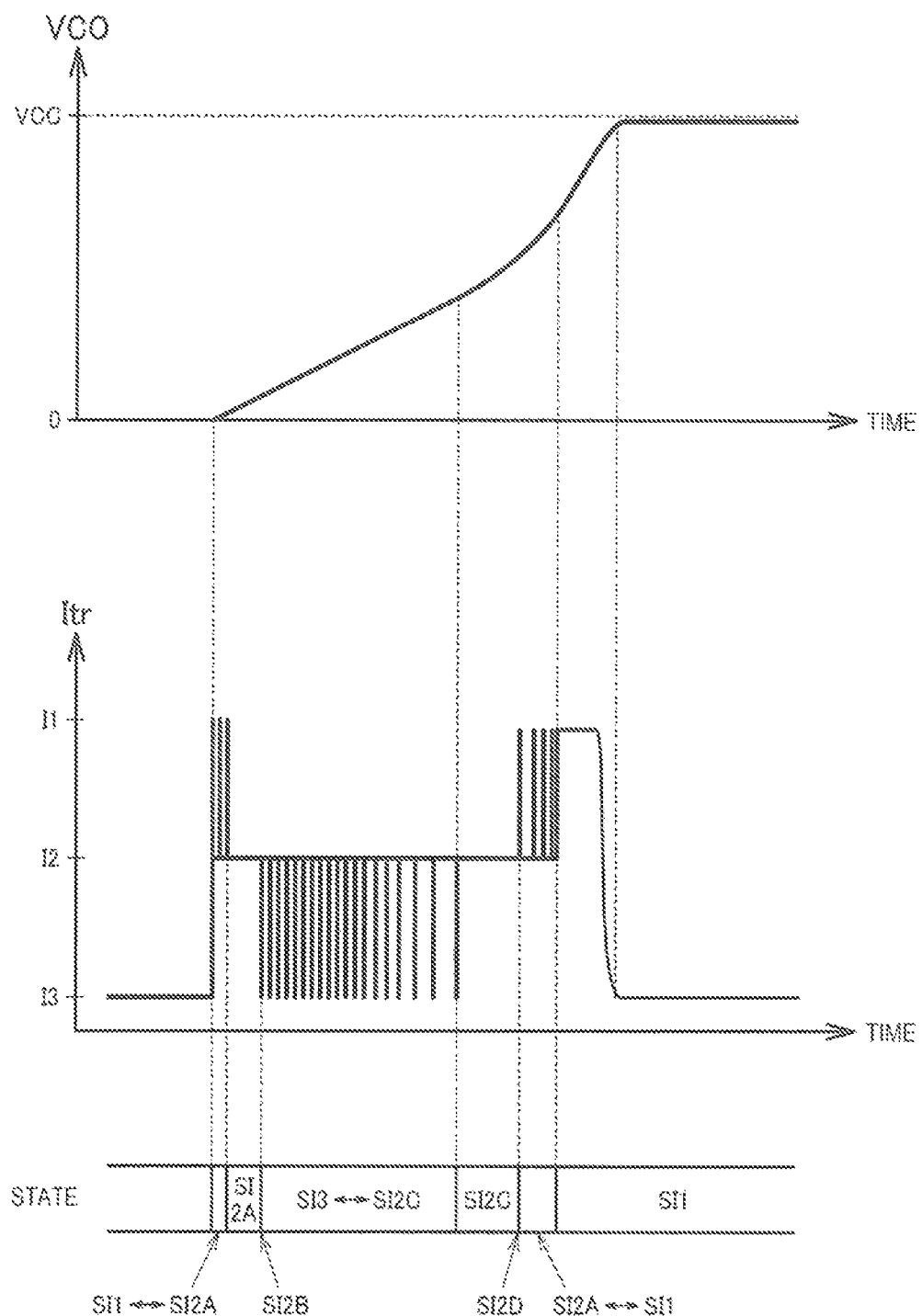
FIG. 4 is a second waveform diagram showing the operation of the charging circuit.

FIG. 4 is a second waveform diagram showing the operation of the charging circuit 180. Hereinafter, the operation of the charging circuit 180 will be described as an example, and the same applies to the operation of the discharging circuit 190. However, in charging, the voltage of the node NLOAD of the load 300 gradually increases with charging, but in discharging, the voltage of the node NLOAD of the load 300 gradually decreases with discharging.

When the charge control is started, the voltage of the node NLOAD of the load 300, that is, the source voltage VCO of the external transistor 11 is 0 V. Therefore, the voltage between the source and the drain of the transistor 189 is the power supply voltage VCC, the heat generation amount when the transistor current Itr=I1 flows in the state SI1 is large, the temperature of the transistor 189 rises in a short time, the state transitions to SI2A, and the transistor current Itr becomes I2. Immediately after the start of charging, since the temperature around the transistor 189 does not rise, the heat of the transistor 189 is likely to diffuse to the surroundings. Therefore, the temperature of the transistor 189 drops, the state transitions to SI1, and the transistor current Itr becomes I1.

As the transitions are repeated, the temperature around the transistor 189 rises. Therefore, the heat of the transistor 189 is less likely to diffuse to the surroundings, and the temperature of the transistor 189 is less likely to fall. Then, the state stays in SI2A, and after the first period WAIT1 elapses in the state SI2A, the state transitions to SI2B. When it is determined that the detected temperature TIC is equal to or higher than the first threshold value TH in the state SI2B, the state transitions to SI3 and the transistor current Itr becomes I3. The transistor current Itr drops, so that the temperature of the transistor 189 drops, the state transitions to SI2C, and the transistor current Itr becomes I2. After that, the state goes back and forth between SI3 and SI2C.

Since the capacity of the node NLOAD of the load 300 is charged by the transistor current Itr, the source voltage VCO of the external transistor 11 rises. Then, since a voltage between the source and the drain of the external transistor 11 decreases, the heat generation amount of the transistor 189 decreases, and the state stays in SI2C for a long time. After the second period WAIT2 elapses in the state SI2C, the state transitions to SI2D. When it is determined that the detected temperature TIC is lower than the second threshold value TL in the state SI2D, the state transitions to SI1 and the transistor current Itr becomes I1. The transistor current Itr increases, so that the temperature of the transistor 189 rises, the state transitions to SI2A, and the transistor current Itr becomes I2.

When the transitions are repeated, the source voltage VCO further increases. Therefore, the voltage between the source and the drain of the external transistor 11 decreases, and the heat generation amount of the transistor 189 decreases. Then, the state stays in SI1, and when the capacity of the node NLOAD of the load 300 is charged to the power supply voltage VCC, no current flows through the transistor 189. Then, the transistor 189 is turned off and the external transistor 11 is turned on.

In the above embodiment, the circuit device 100 includes the control circuit 185 that controls the transistor current based on a detected temperature. The detected temperature is a temperature detected by the temperature sensor circuit 188 that detects the temperature of the transistor 189. The transistor 189 charges the load 300 to which the power supply voltage VCC is supplied. The transistor current is a current flowing through the transistor 189 during charging. The control circuit 185 reduces the transistor current when the detected temperature is higher than the first threshold value TH, and increases the transistor current when the detected temperature is lower than the second threshold value TL lower than the first threshold value TH.

According to the present embodiment, since the transistor current decreases when the detected temperature is higher than the first threshold value TH, the temperature of the transistor 189 decreases. Accordingly, the transistor 189 can be protected from overheating. Since the transistor current increases when the detected temperature is lower than the second threshold value TL, the transistor current is controlled such that the detected temperature is in a range from the second threshold value TL to the first threshold value TH. Accordingly, the capacity of the node NLOAD of the load 300 can be charged with the transistor current as large as possible for the transistor 189 within a range not exceeding the first threshold value TH which is the allowable temperature.

In FIG. 1, the example has been described in which the transistor 189 and the temperature sensor circuit 188 are provided inside the circuit device 100. However, the present disclosure is not limited thereto, and the transistor 189 and the temperature sensor circuit 188 may be provided outside the circuit device 100.

In the above embodiment, the circuit device 100 includes the control circuit 195 that controls the transistor current based on a detected temperature. The detected temperature is a temperature detected by the temperature sensor circuit 198 that detects the temperature of the transistor 199. The transistor 199 discharges the load 300 to which the power supply voltage VCC is supplied. The transistor current is a current flowing through the transistor 199 during discharging. The control circuit 195 reduces the transistor current when the detected temperature is higher than the first threshold value TH, and increases the transistor current when the detected temperature is lower than the second threshold value TL lower than the first threshold value TH.

According to the present embodiment, since the transistor current decreases when the detected temperature is higher than the first threshold value TH, the temperature of the transistor 199 decreases. Accordingly, the transistor 199 can be protected from overheating. Since the transistor current increases when the detected temperature is lower than the second threshold value TL, the transistor current is controlled such that the detected temperature is in a range from the second threshold value TL to the first threshold value TH. Accordingly, the capacity of the node NLOAD of the load 300 can be discharged with the transistor current as large as possible for the transistor 199 within the range not exceeding the first threshold value TH which is the allowable temperature.

In FIG. 1, the example has been described in which the transistor 199 and the temperature sensor circuit 198 are provided inside the circuit device 100. However, the present disclosure is not limited thereto, and the transistor 199 and the temperature sensor circuit 198 may be provided outside the circuit device 100.

Although FIG. 1 shows an example in which the circuit device 100 includes both the charging circuit 180 and the discharging circuit 190, the circuit device 100 may include only one of the charging circuit 180 and the discharging circuit 190.

Hereinafter, the control circuit 185 will be described as an example, and the same applies to the control circuit 195.

In the present embodiment, the control circuit 185 executes control to set the transistor current to the first current value I1, the second current value I2 smaller than the first current value I1, or the third current value I3 smaller than the second current value I2. The control circuit 185 executes control to set the transistor current to the third current value I3 when the transistor current is the second current value I2 and the detected temperature is higher than the first threshold value TH. This control corresponds to the transition from SI2B to SI3 or the transition from SI2C to SI3 in the example in FIG. 3. The control circuit 185 executes control to set the transistor current to the first current value I1 when the transistor current is the second current value I2 and the detected temperature is lower than the second threshold value TL. This control corresponds to the transition from SI2A to SI1 or the transition from SI2D to SI1 in the example in FIG. 3.

According to the present embodiment, when the detected temperature is higher than the first threshold value TH, the transistor current can be reduced by changing the transistor current from the second current value I2 to the third current value I3 by the control circuit 185. When the detected temperature is higher than the second threshold value TL, the transistor current can be increased by changing the transistor current from the second current value I2 to the first current value I1 by the control circuit 185.

In the present embodiment, the control circuit 185 executes control to set the transistor current to the second current value I2 when the transistor current is the first current value I1 and the detected temperature is higher than the first threshold value TH. This control corresponds to the transition from SI1 to SI2A in the example in FIG. 3. The control circuit 185 determines whether the detected temperature is higher than the first threshold value TH after the first period WAIT1 elapses after setting the transistor current to the second current value I2, and sets the transistor current to the third current value I3 when it is determined that the detected temperature is higher than the first threshold value TH. This control corresponds to the transition from SI2A to SI2B and the transition from SI2B to SI3 in the example in FIG. 3.

In a case in which the transistor current is the first current value I1, when the detected temperature exceeds the first threshold value TH, the transistor current becomes the second current value I2. At this time, it is considered that the detected temperature temporarily exceeds the first threshold value TH. If the first period WAIT1 is not set, since the detected temperature exceeds the first threshold value TH, the transistor current is changed from the second current value I2 to the third current value I3. That is, although the temperature may decrease due to a decrease of the transistor current to the second current value I2, the transistor current further decreases to the third current value I3. In this regard, according to the present embodiment, when the temperature starts to decrease after the transistor current decreases to the second current value I2, since the first period WAIT1 for waiting until the temperature falls below the first threshold value TH is set, the transistor current does not decrease to the third current value I3. Accordingly, the transistor current can transition between the two states, that is, between the first current value I1 and the second current value I2.

In the present embodiment, the control circuit 185 executes control to set the transistor current to the second current value I2 when the transistor current is the third current value I3 and the detected temperature is lower than the second threshold value TL. This control corresponds to the transition from SI3 to SI2C in the example in FIG. 3. The control circuit 185 determines whether the detected temperature is lower than the second threshold value TL after the second period WAIT2 elapses after setting the transistor current to the second current value I2, and executes control to set the transistor current to the first current value I1 when it is determined that the detected temperature is lower than the second threshold value TL. This control corresponds to the transition from SI2C to SI2D and the transition from SI2D to SI1 in the example in FIG. 3.

In a case in which the transistor current is the third current value I3, when the detected temperature falls below the second threshold value TL, the transistor current becomes the second current value I2. At this time, it is considered that the detected temperature temporarily falls below the second threshold value TL. If the second period WAIT2 is not set, since the detected temperature is below the second threshold value TL, the transistor current is changed from the second current value I2 to the first current value I1. That is, although the temperature may rise due to an increase of the transistor current to the second current value I2, the transistor current further increases to the first current value I1. In this regard, according to the present embodiment, when the temperature starts to rise after the transistor current increases to the second current value I2, since the second period WAIT2 for waiting until the temperature exceeds the second threshold value TL is set, the transistor current does not increase to the first current value I1. Accordingly, the transistor current can transition between the two states, that is, between the third current value I3 and the second current value I2.

In the present embodiment, a length of the second period WAIT2 is longer than a length of the first period WAIT1.

Since the heat of the transistor 189 diffuses to the surroundings, it is assumed that the temperature of the transistor 189 rises slower than the temperature of the transistor 189 drops. Therefore, the second period WAIT2 for waiting for the detected temperature to exceed the second threshold value TL is set longer than the first period WAIT1 for waiting for the detected temperature to fall below the first threshold value TH, so that appropriate weight control is achieved.

In the present embodiment, the transistor 189 is coupled in parallel to the external transistor 11 provided between the node NVCC of the power supply voltage VCC and the node NLOAD of the load 300. The transistor 189 charges the load 300 before the external transistor 11 is turned on.

By coupling the transistor 189 in parallel with the external transistor 11, the capacity of the node NLOAD of the load 300 can be charged by the transistor current of the transistor 189 before the external transistor 11 is turned on. According to the present embodiment, it is possible to protect the transistor 189 from overheating and to charge the capacity of the node NLOAD as fast as possible within a range that the transistor 189 can be protected.

In the present embodiment, the transistor 199 is provided between the node NLOAD of the load 300 and the ground node. The transistor 199 discharges the load 300 after the external transistor 11 is turned off.

By providing the transistor 199 between the node NLOAD of the load 300 and the ground node, the capacity of the node NLOAD of the load 300 can be discharged by the transistor current of the transistor 199 after the external transistor 11 is turned off. According to the present embodiment, it is possible to protect the transistor 199 from overheating and to discharge the capacity of the node NLOAD as fast as possible within a range that the transistor 199 can be protected.

2. Detailed Configuration Example

Figure 5:
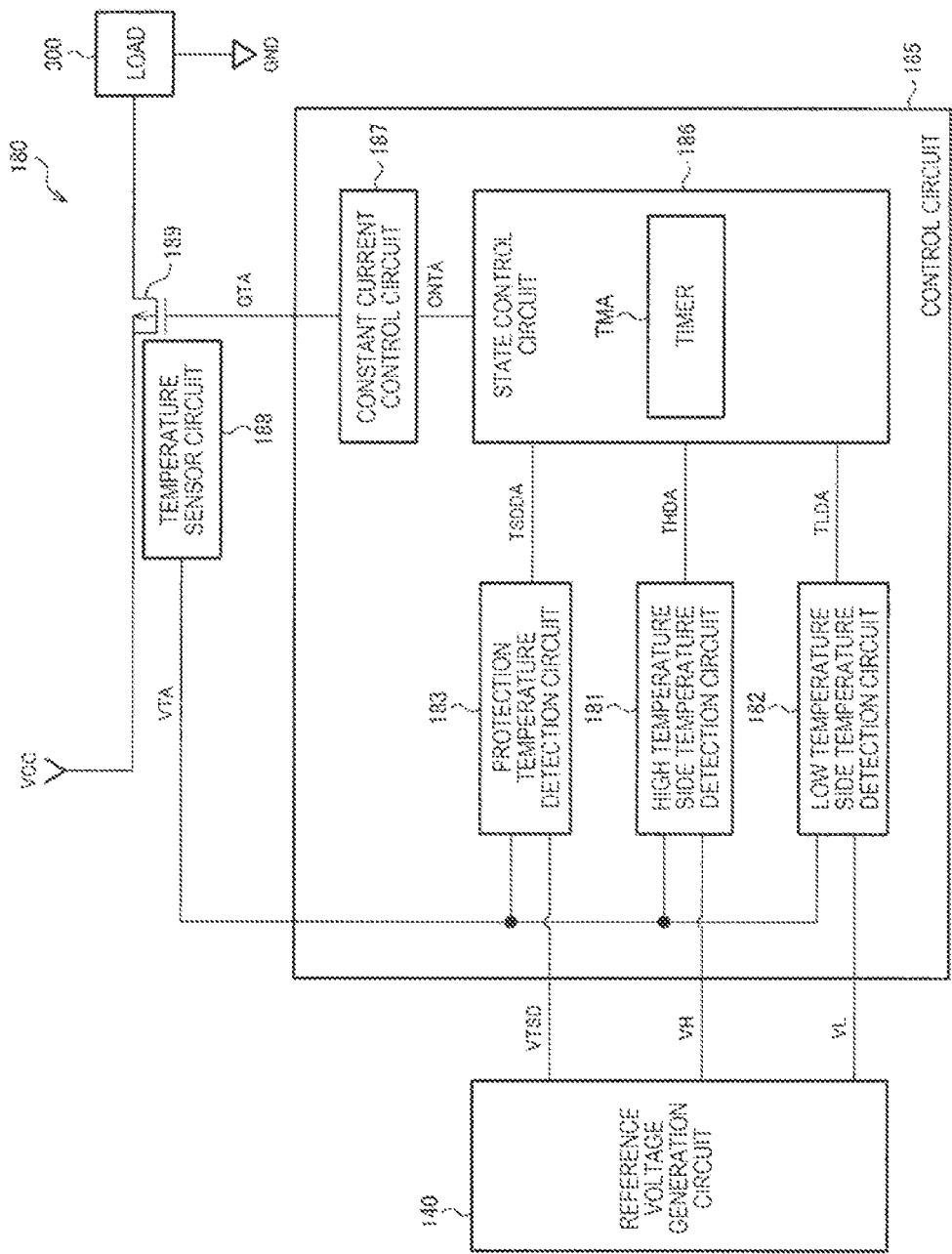
FIG. 5 is a detailed configuration example of the charging circuit.

FIG. 5 is a detailed configuration example of the charging circuit 180. The charging circuit 180 includes the transistor 189, the temperature sensor circuit 188, the control circuit 185, and a reference voltage generation circuit 140.

The reference voltage generation circuit 140 generates a first reference voltage VH, a second reference voltage VL, and a third reference voltage VTSD. The first reference voltage VH is a voltage corresponding to the first threshold value TH, and is the same voltage value as the temperature detection voltage VTA when the detected temperature TIC is the first threshold value TH. The second reference voltage VL is a voltage corresponding to the second threshold value TL, and is the same voltage value as the temperature detection voltage VTA when the detected temperature TIC is the second threshold value TL. The third reference voltage VTSD is a voltage corresponding to a third threshold value Tmax, and is the same voltage value as the temperature detection voltage VTA when the detected temperature TIC is the third threshold value Tmax. As shown in FIG. 3, the third threshold value Tmax is a temperature higher than the first threshold value TH, and corresponds to an allowable upper limit temperature of the circuit device 100.

The control circuit 185 includes a high temperature side temperature detection circuit 181, a low temperature side temperature detection circuit 182, a protection temperature detection circuit 183, a state control circuit 186, and a constant current control circuit 187.

The high temperature side temperature detection circuit 181 detects whether the temperature detection voltage VTA is higher than the first reference voltage VH, and outputs a detection signal THDA thereof.

The low temperature side temperature detection circuit 182 detects whether the temperature detection voltage VTA is lower than the second reference voltage VL, and outputs a detection signal TLDA thereof.

The protection temperature detection circuit 183 detects whether the temperature detection voltage VTA is higher than the third reference voltage VTSD, detects whether the temperature detection voltage VTA becomes lower than a fourth reference voltage Vmin after the temperature detection voltage VTA exceeds the third reference voltage VTSD, and outputs a detection signal TSDDA thereof. The fourth reference voltage Vmin is a voltage corresponding to a fourth threshold value Tmin. As shown in FIG. 3, the fourth threshold value Tmin is a voltage lower than the second threshold value TL.

The state control circuit 186 executes the control described with reference to FIG. 2 based on the detection signals THDA and TLDA. At this time, the state control circuit 186 outputs a current setting signal CNTA for setting a current value of the transistor current to the constant current control circuit 187. The constant current control circuit 187 controls the transistor current to a current value indicated by the current setting signal CNTA by outputting the gate voltage GTA corresponding to the current value indicated by the current setting signal CNTA to a gate of the transistor 189. The state control circuit 186 includes a timer TMA, and uses the timer TMA to execute weight control of the first period WAIT1 in the state SI2A and weight control of the second period WAIT2 in the state SI2C.

When the detection signal TSDDA indicating that the temperature of the transistor 189 exceeds the third threshold value Tmax is input, the state control circuit 186 stops the control shown in FIG. 2 and outputs the current setting signal CNTA for turning off the transistor 189. Then, the state control circuit 186 resumes the control in FIG. 2 when the detection signal TSDDA indicating that the temperature of the transistor 189 falls below the fourth threshold value Tmin is input.

When the protection temperature detection circuit 183 outputs the detection signal TSDDA indicating that the temperature of the transistor 189 exceeds the third threshold value Tmax, the circuit device 100 is in a shutdown state. Then, when the protection temperature detection circuit 183 outputs the detection signal TSDDA indicating that the temperature of the transistor 189 falls below the fourth threshold value Tmin, the circuit device 100 releases the shutdown state.

Figure 6:
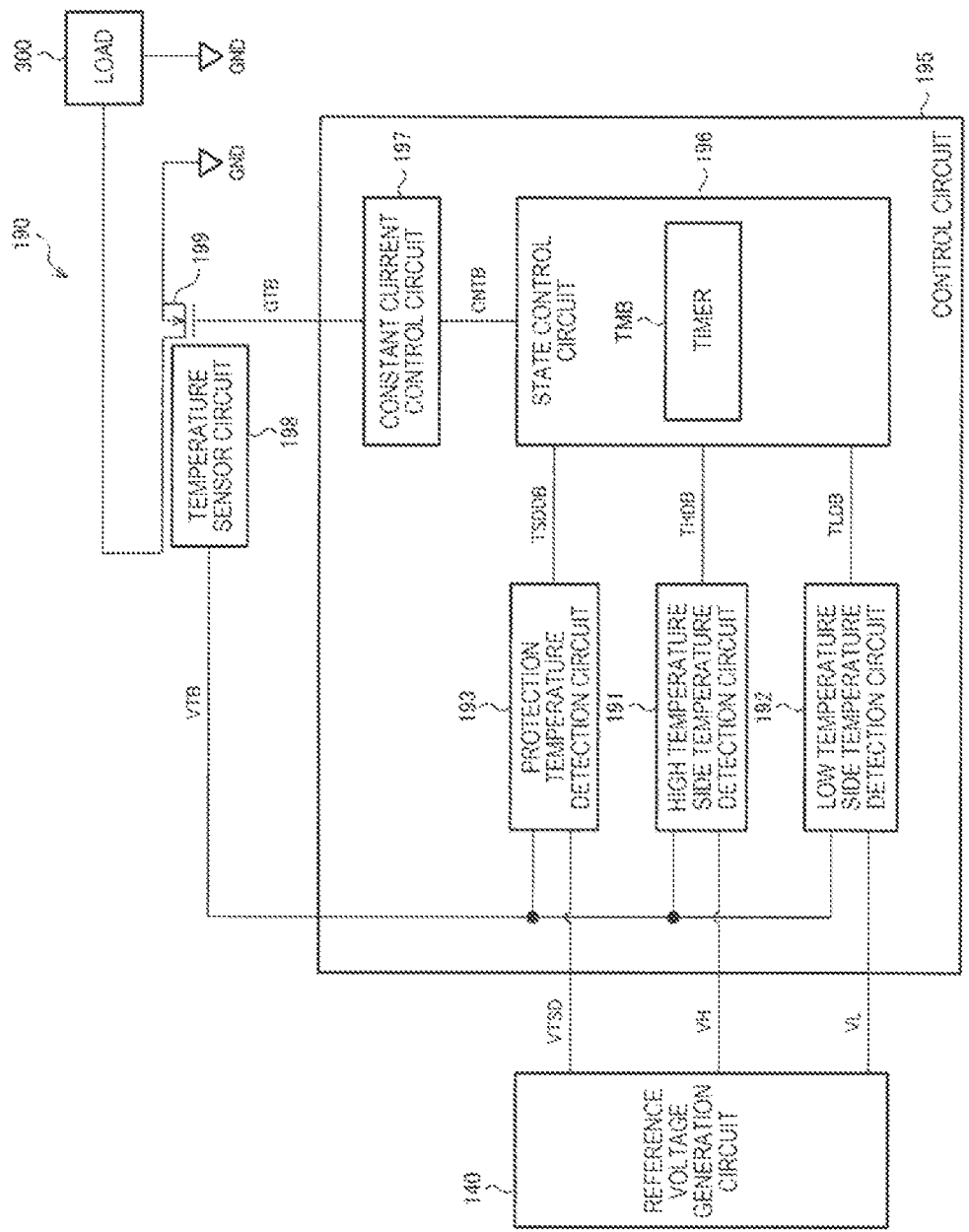
FIG. 6 is a detailed configuration example of a discharging circuit.

FIG. 6 is a detailed configuration example of the charging circuit 190. The discharging circuit 190 includes the transistor 199, the temperature sensor circuit 198, and the control circuit 195. FIG. 6 shows an example in which a common reference voltage generation circuit 140 is provided for the charging circuit 180 and the discharging circuit 190. However, reference voltage generation circuits may be provided separately for the charging circuit 180 and the discharging circuit 190.

The control circuit 195 includes a high temperature side temperature detection circuit 191, a low temperature side temperature detection circuit 192, a protection temperature detection circuit 193, a state control circuit 196, and a constant current control circuit 197.

The high temperature side temperature detection circuit 191 detects whether the temperature detection voltage VTB is higher than the first reference voltage VH, and outputs a detection signal THDB thereof.

The low temperature side temperature detection circuit 192 detects whether the temperature detection voltage VTB is lower than the second reference voltage VL, and outputs a detection signal TLDB thereof.

The protection temperature detection circuit 193 detects whether the temperature detection voltage VTB is higher than the third reference voltage VTSD, detects whether the temperature detection voltage VTB becomes lower than the fourth reference voltage Vmin after the temperature detection voltage VTB exceeds the third reference voltage VTSD, and outputs a detection signal TSDDB thereof.

The state control circuit 196 executes the same control as in FIG. 2 based on the detection signals THDB and TLDB. At this time, the state control circuit 196 outputs a current setting signal CNTB for setting a current value of the transistor current to the constant current control circuit 197. The constant current control circuit 197 controls the transistor current to a current value indicated by the current setting signal CNTB by outputting the gate voltage GTB corresponding to the current value indicated by the current setting signal CNTB to a gate of the transistor 199. The state control circuit 196 includes a timer TMB, and uses the timer TMB to execute weight control of the first period WAIT1 in the state SI2A and weight control of the second period WAIT2 in the state SI2C.

When the detection signal TSDDB indicating that the temperature of the transistor 199 exceeds the third threshold value Tmax is input, the state control circuit 196 stops the control in FIG. 2 and outputs the current setting signal CNTB for turning off the transistor 199. Then, the state control circuit 196 resumes the control in FIG. 2 when the detection signal TSDDB indicating that the temperature of the transistor 199 falls below the fourth threshold value Tmin is input.

When the protection temperature detection circuit 193 outputs the detection signal TSDDB indicating that the temperature of the transistor 199 exceeds the third threshold value Tmax, the circuit device 100 is in a shutdown state. Then, when the protection temperature detection circuit 193 outputs the detection signal TSDDB indicating that the temperature of the transistor 199 falls below the fourth threshold value Tmin, the circuit device 100 releases the shutdown state.

Figure 7:
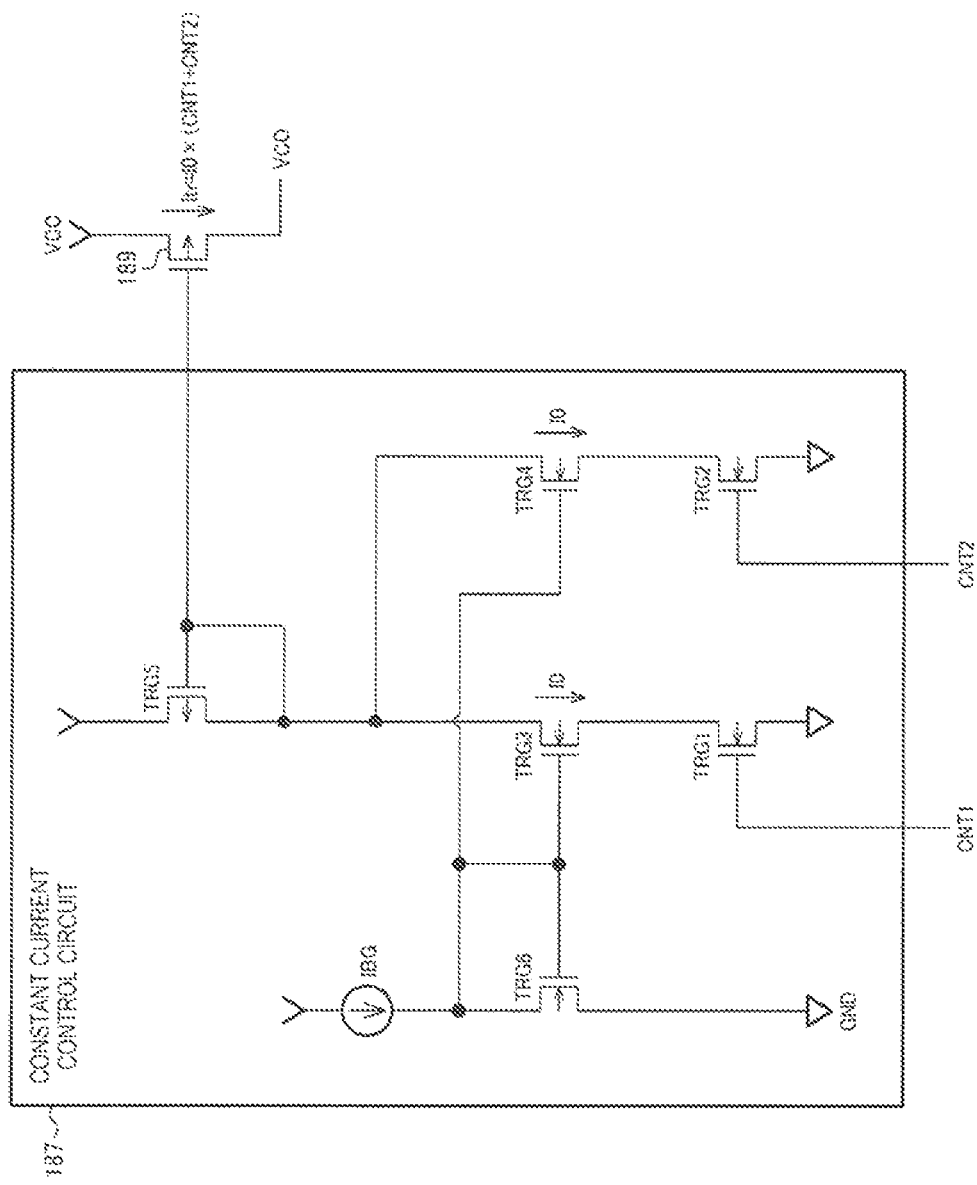
FIG. 7 is a detailed configuration example of a constant current control circuit.

FIG. 7 is a detailed configuration example of the constant current control circuit 187. The constant current control circuit 197 has a similar configuration. The constant current control circuit 187 includes a current source IBG and transistors TRG1 to TRG6.

The transistors TRG6, TRG3, and TRG4 are N-type transistors and constitute a current mirror circuit. The current output by the current source IBG flows through the transistor TRG6, and the current is mirrored to a current flowing through the transistors TRG3 and TRG4. The mirrored current is set as I0.

The transistors TRG1 and TRG2 are N-type transistors. The transistor TRG1 is provided in series with the transistor TRG3, and the current I0 flows through the transistor TRG3 when the transistor TRG1 is on. The transistor TRG2 is provided in series with the transistor TRG4, and the current I0 flows through the transistor TRG4 when transistor TRG2 is on. A signal CNT1 is received from the control circuit 185 to a gate of the transistor TRG1, and the transistor TRG1 is off when CNT1=0 and is on when CNT1=1. A signal CNT2 is received from the control circuit 185 to a gate of the transistor TRG2, and the transistor TRG2 is off when CNT2=0 and is on when CNT2=1. The signals CNT1 and CNT2 correspond to the current setting signal CNTA in FIG. 5.

The transistor TRG5 is a P-type transistor. The current flowing through the transistors TRG3 and TRG4 flows through the transistor TRG5, and the current is mirrored to the transistor current Itr flowing through the transistor 189. The transistor current is Itr=I0×(CNT1+CNT2), and three states which are Itr=0, I0, and 2×I0 can be taken. In this example, I1, I2, I3 in FIG. 2 are 0, I0, 2×I0.

Figure 8:
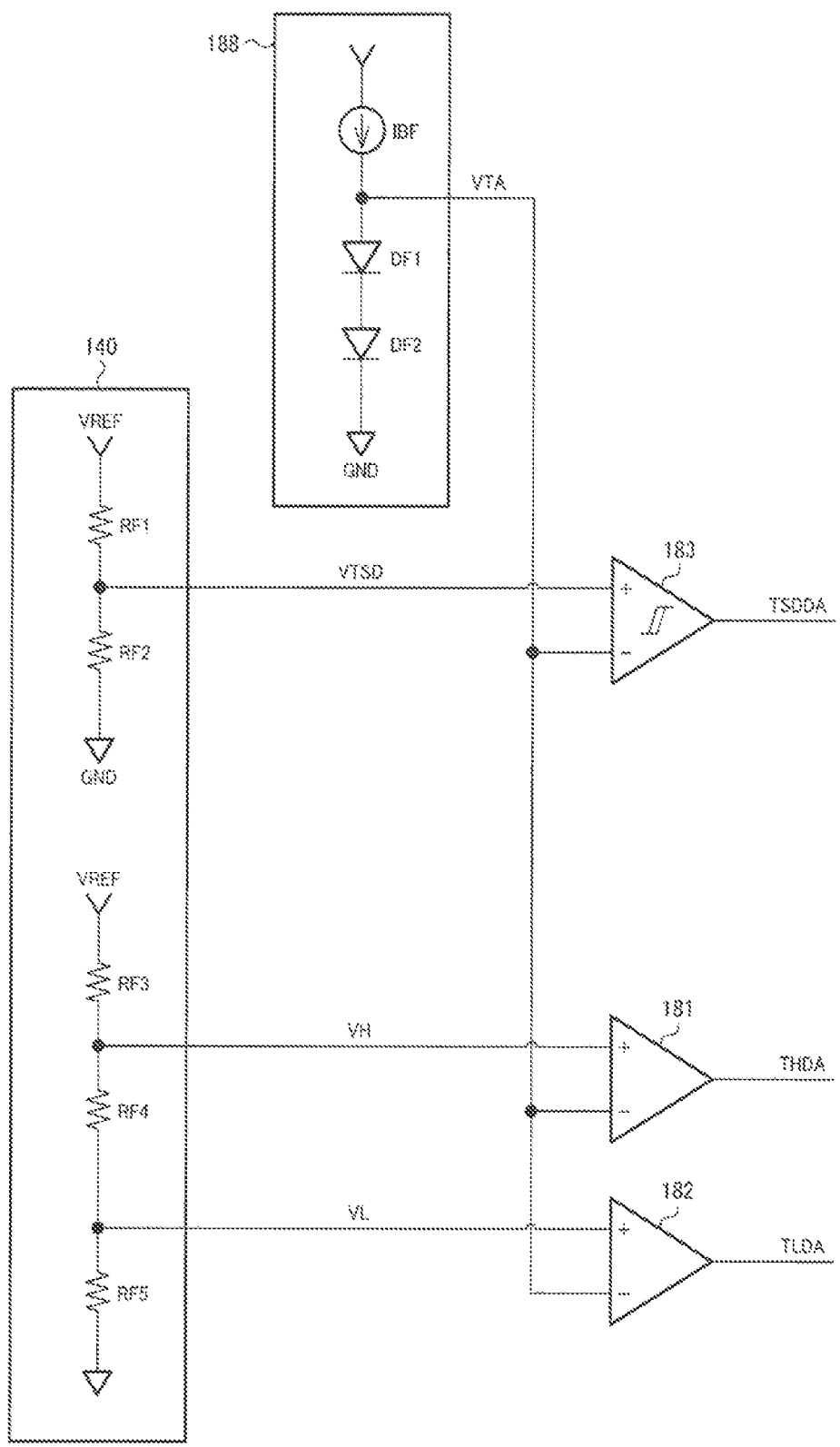
FIG. 8 is a detailed configuration example of a temperature sensor circuit, a reference voltage generation circuit, a high temperature side temperature detection circuit, a low temperature side temperature detection circuit, and a protection temperature detection circuit.

FIG. 8 is a detailed configuration example of the temperature sensor circuit 188, the reference voltage generation circuit 140, the high temperature side temperature detection circuit 181, the low temperature side temperature detection circuit 182, and the protection temperature detection circuit 183. The high temperature side temperature detection circuit 191, the low temperature side temperature detection circuit 192, and the protection temperature detection circuit 193 have the same configuration.

The temperature sensor circuit 188 includes a current source IBF and diodes DF1 and DF2. A current output by the current source IBF flows through the diodes DF1 and DF2 coupled in series, so that a voltage twice a forward voltage of the diode is generated at an anode of the diode DF1. The voltage is the temperature detection voltage VTA.

The reference voltage generation circuit 140 includes a first ladder resistance circuit including resistors RF3 to RF5 and a second ladder resistance circuit including resistors RF1 and RF2. The first ladder resistor circuit generates the first reference voltage VH and the second reference voltage VL by dividing a reference voltage VREF. The second ladder resistance circuit generates the third reference voltage VTSD by dividing the reference voltage VREF.

The high temperature side temperature detection circuit 181 is a comparator that compares the temperature detection voltage VTA with the first reference voltage VH. The comparator outputs a low-level detection signal THDA when VTA>VH, and outputs a high-level detection signal THDA when VTA<VH.

The low temperature side temperature detection circuit 182 is a comparator that compares the temperature detection voltage VTA with the second reference voltage VL. The comparator outputs a low-level detection signal TLDA when VTA>VL and outputs a high-level detection signal TLDA when VTA<VL.

The protection temperature detection circuit 183 is a hysteresis comparator that compares the temperature detection voltage VTA with the third reference voltage VTSD. The hysteresis comparator changes the detection signal TSDDA from a high level to a low level when VTA>VTSD in a case in which the detection signal TSDDA is a high-level detection signal. The hysteresis comparator changes the detection signal TSDDA from a low level to a high level when VTA<VTSD in a case in which the detection signal TSDDA is a low-level detection signal.

Figure 9:
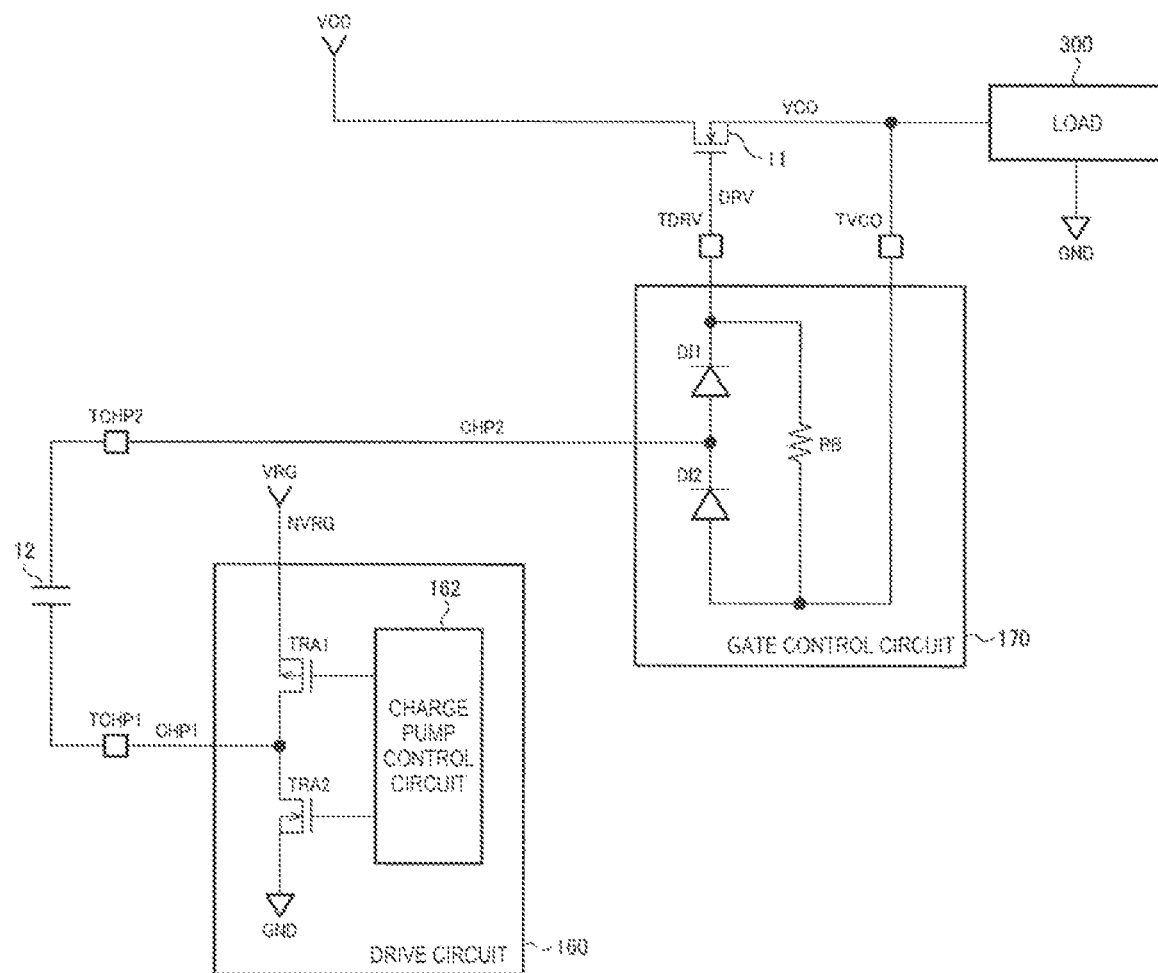
FIG. 9 is a detailed configuration example of a drive circuit and a gate control circuit.

FIG. 9 is a detailed configuration example of the drive circuit 160 and the gate control circuit 170 that constitute the charge pump circuit 120.

The drive circuit 160 includes a first transistor TRA1, a second transistor TRA2, and a charge pump control circuit 162. The first transistor TRA1 is a P-type transistor, and includes a source coupled to an output node NVRG of the regulator 110 and a drain coupled to the terminal TCHP1. The second transistor TRA2 is an N-type transistor, and includes a source coupled to the ground node and a drain coupled to the terminal TCHP1.

The gate control circuit 170 includes a first diode DI1, a second diode DI2, and a resistor RB. An anode of the first diode DI1 is coupled to the terminal TCHP2 and a cathode of the first diode DI1 is coupled to the terminal TDRV. An anode of the second diode DI2 is coupled to the terminal TVCO and a cathode of the second diode DI2 is coupled to the terminal TCHP2. The first diode DI1 and the second diode DI2 are, for example, Schottky barrier diodes. One end of the resistor RB is coupled to the cathode of the first diode DI1 and the terminal TDRV, and the other end of the resistor RB is coupled to the anode of the second diode DI2 and the terminal TVCO.

An operation of the charge pump circuit 120 will be described. Hereinafter, a description will be made ignoring forward voltages of the first diode DI1 and the second diode DI2.

The charge pump control circuit 162 alternately turns on the first transistor TRA1 and the second transistor TRA2. The drive signal CHP1 is 0 V when the first transistor TRA1 is off and the second transistor TRA2 is on. At this time, the signal CHP2 has the same voltage as the source voltage VCO due to the second diode DI2. When the first transistor TRA1 is turned from off to on and the second transistor TRA2 is turned from on to off, the drive signal CHP1 rises from 0 V to the regulated voltage VRG. Accordingly, the signal CHP2 is a voltage higher than the source voltage VCO by the regulated voltage VRG.

This voltage VCO+VRG is the gate control voltage DRV and is output to a gate of the external transistor 11 via the first diode DI1. The gate of the external transistor 11 is charged by a charge supplied by the drive circuit 160, and the gate control voltage DRV is maintained at VCO+VRG in a steady state.

When the charge pump circuit 120 is stopped, the charge pump control circuit 162 does not drive the first transistor TRA1 and the second transistor TRA2. For example, the charge pump control circuit 162 keeps the first transistor TRA1 on and the second transistor TRA2 off. After the charge pump circuit 120 is stopped, the resistor RB causes a gate-source voltage of the external transistor 11 to be 0 V.

The circuit device according to the present embodiment described above includes a control circuit that controls a transistor current flowing through a transistor in charging based on a detected temperature detected by a temperature sensor circuit that detects a temperature of the transistor. The transistor charges a load to which a power supply voltage is supplied. The control circuit reduces the transistor current when the detected temperature is higher than a first threshold value, and increases the transistor current when the detected temperature is lower than a second threshold value lower than the first threshold value.

According to the present embodiment, since the transistor current decreases when the detected temperature is higher than the first threshold value, the temperature of the transistor decreases. Accordingly, the transistor can be protected from overheating. Since the transistor current increases when the detected temperature is lower than the second threshold value, the transistor current is controlled such that the detected temperature is in a range from the second threshold value to the first threshold value. Accordingly, a capacity of a node of the load can be charged with the transistor current as large as possible for the transistor within a range not exceeding the first threshold value which is an allowable temperature.

The circuit device according to the present embodiment includes a control circuit that controls a transistor current flowing through a transistor in discharging based on a detected temperature detected by a temperature sensor circuit that detects a temperature of the transistor. The transistor discharges a load to which a power supply voltage is supplied. The control circuit reduces the transistor current when the detected temperature is higher than the first threshold value, and increases the transistor current when the detected temperature is lower than the second threshold value lower than the first threshold value.

According to the present embodiment, since the transistor current decreases when the detected temperature is higher than the first threshold value, the temperature of the transistor decreases. Accordingly, the transistor can be protected from overheating. Since the transistor current increases when the detected temperature is lower than the second threshold value, the transistor current is controlled such that the detected temperature is in a range from the second threshold value to the first threshold value. Accordingly, the capacity of the node of the load can be discharged with the transistor current as large as possible for the transistor within a range not exceeding the first threshold value which is the allowable temperature.

In the present embodiment, the control circuit may execute control to set the transistor current to a first current value, a second current value smaller than the first current value, or a third current value smaller than the second current value. The control circuit may execute control to set the transistor current to the third current value when the transistor current is the second current value and the detected temperature is higher than the first threshold value. The control circuit may execute control to set the transistor current to the first current value when the transistor current is the second current value and the detected temperature is lower than the second threshold value.

According to the present embodiment, when the detected temperature is higher than the first threshold value, the transistor current can be reduced by changing the transistor current from the second current value to the third current value by the control circuit. When the detected temperature is lower than the second threshold value, the transistor current can be increased by changing the transistor current from the second current value to the first current value by the control circuit.

In the present embodiment, the control circuit may execute control to set the transistor current to the second current value when the transistor current is the first current value and the detected temperature is higher than the first threshold value. The control circuit determines whether the detected temperature is higher than the first threshold value after a first period elapses after setting the transistor current to the second current value, and may set the transistor current to the third current value when it is determined that the detected temperature is higher than the first threshold value.

According to the present embodiment, when the temperature starts to decrease after the transistor current decreases to the second current value, since the first period for waiting until the temperature falls below the first threshold value TH is set, the transistor current does not decrease to the third current value. Accordingly, in a case in which the temperature drops when the transistor current is the second current value, the transistor current can be transitioned between two states, that is, between the first current value and the second current value.

In the present embodiment, the control circuit may execute control to set the transistor current to the second current value when the transistor current is the third current value and the detected temperature is lower than the second threshold value. The control circuit determines whether the detected temperature is lower than the second threshold value after a second period elapses after setting the transistor current to the second current value, and may execute control to set the transistor current to the first current value when it is determined that the detected temperature is lower than the second threshold value.

According to the present embodiment, when the temperature starts to rise after the transistor current increases to the second current value, since the second period for waiting until the temperature exceeds the second threshold value is set, the transistor current does not increase to the first current value. Accordingly, in a case in which the temperature rises when the transistor current is the second current value, the transistor current can be transitioned between two states, that is, between the third current value and the second current value.

In the present embodiment, a length of the second period may be larger than a length of the first period.

Since heat of the transistor diffuses to the surroundings, it is assumed that the temperature of the transistor rises slower than the temperature of the transistor drops. Therefore, the second period for waiting for the detected temperature to exceed the second threshold value is set longer than the first period for waiting for the detected temperature to fall below the first threshold value, so that appropriate weight control is achieved.

In the present embodiment, the transistor is coupled in parallel to an external transistor provided between a node of the power supply voltage and the node of the load. The transistor may charge the load before the external transistor is turned on.

By coupling the transistor in parallel with the external transistor, the load can be charged by the transistor current of the transistor before the external transistor is turned on. According to the present embodiment, it is possible to protect the transistor from overheating and to charge the load as fast as possible within a range that the transistor can be protected.

In the present embodiment, a transistor is provided between the node of the load and a ground node. The transistor may discharge the load after the external transistor provided between the node of the power supply voltage and the node of the load is turned off.

By providing the transistor between the node of the load and the ground node, the load can be discharged by the transistor current of the transistor after the external transistor is turned off. According to the present embodiment, it is possible to protect the transistor from overheating and to discharge the load as fast as possible within a range that the transistor can be protected.

The circuit device according to the present embodiment may include the transistor and the temperature sensor circuit.

Although the present embodiment has been described in detail as described above, it will be readily apparent to those skilled in the art that many modifications may be made without departing substantially from novel matters and effects of the present disclosure. Therefore, all such modifications are intended to be included in the scope of the present disclosure. For example, in the specification or the drawings, a term which is described at least once together with a different term having a broader meaning or the same meaning can be replaced with the different term in any parts of the specification or the drawings. All combinations of the present embodiment and the modifications are also included in the scope of the present disclosure. Configurations and operations of the charging circuit, the discharging circuit, the regulator, the charge pump circuit, the circuit device, the load, the electronic device, and the like are not limited to those described in the present embodiment, and various modifications may be made.

What is claimed is:

1. A circuit device comprising:
a control circuit configured to control a transistor current flowing through a transistor in charging based on a detected temperature detected by a temperature sensor circuit that detects a temperature of the transistor, the transistor charging a load to which a power supply voltage is supplied, wherein
the control circuit reduces the transistor current when the detected temperature is higher than a first threshold value, and increases the transistor current when the detected temperature is lower than a second threshold value lower than the first threshold value,
wherein the transistor is coupled in parallel to an external transistor provided between a node of the power supply voltage and a node of the load, and
the transistor charges the load before the external transistor is turned on.

2. The circuit device according to claim 1, wherein the control circuit
executes control to set the transistor current to a first current value, a second current value smaller than the first current value, or a third current value smaller than the second current value, and
the control circuit
executes control to set the transistor current to the third current value when the transistor current is the second current value and the detected temperature is higher than the first threshold value, and
executes control to set the transistor current to the first current value when the transistor current is the second current value and the detected temperature is lower than the second threshold value.

3. The circuit device according to claim 2, wherein the control circuit
executes control to set the transistor current to the second current value when the transistor current is the first current value and the detected temperature is higher than the first threshold value,
determines whether the detected temperature is higher than the first threshold value after a first period elapses after setting the transistor current to the second current value, and
sets the transistor current to the third current value when it is determined that the detected temperature is higher than the first threshold value.

4. The circuit device according to claim 3, wherein the control circuit
executes control to set the transistor current to the second current value when the transistor current is the third current value and the detected temperature is lower than the second threshold value,
determines whether the detected temperature is lower than the second threshold value after a second period elapses after setting the transistor current to the second current value, and
executes control to set the transistor current to the first current value when it is determined that the detected temperature is lower than the second threshold value.

5. The circuit device according to claim 4, wherein a length of the second period is larger than a length of the first period.

6. The circuit device according to claim 1, further comprising:
the transistor; and
the temperature sensor.

7. A circuit device comprising:
a control circuit configured to control a transistor current flowing through a transistor in discharging based on a detected temperature detected by a temperature sensor circuit that detects a temperature of the transistor, the transistor discharging a load to which a power supply voltage is supplied, wherein
the control circuit reduces the transistor current when the detected temperature is higher than a first threshold value, and increases the transistor current when the detected temperature is lower than a second threshold value lower than the first threshold value.

8. The circuit device according to claim 7, wherein the control circuit
executes control to set the transistor current to a first current value, a second current value smaller than the first current value, or a third current value smaller than the second current value, and
the control circuit
executes control to set the transistor current to the third current value when the transistor current is the second current value and the detected temperature is higher than the first threshold value, and executes control to set the transistor current to the first current value when the transistor current is the second current value and the detected temperature is lower than the second threshold value.

9. The circuit device according to claim 8, wherein the control circuit executes control to set the transistor current to the second current value when the transistor current is the first current value and the detected temperature is higher than the first threshold value, determines whether the detected temperature is higher than the first threshold value after a first period elapses after setting the transistor current to the second current value, and sets the transistor current to the third current value when it is determined that the detected temperature is higher than the first threshold value.

10. The circuit device according to claim 9, wherein the control circuit executes control to set the transistor current to the second current value when the transistor current is the third current value and the detected temperature is lower than the second threshold value, determines whether the detected temperature is lower than the second threshold value after a second period elapses after setting the transistor current to the second current value, and executes control to set the transistor current to the first current value when it is determined that the detected temperature is lower than the second threshold value.

11. The circuit device according to claim 10, wherein a length of the second period is larger than a length of the first period.

12. The circuit device according to claim 7, wherein the transistor is provided between a node of the load and a ground node, and the transistor discharges the load after an external transistor provided between a node of the power supply voltage and the node of the load is turned off.

\* \* \* \* \*